United States Patent [19]

Drier, Jr.

[11] Patent Number: 4,909,681

[45] Date of Patent: Mar. 20, 1990

[54] ROUTER FOR COMPONENT MOUNTED PRINTED CIRCUIT BOARDS

[75] Inventor: Joseph P. Drier, Jr., Bellingham, Mass.

[73] Assignee: Cybernetics Products, Inc., Carlstadt, N.J.

[21] Appl. No.: 265,699

[22] Filed: Nov. 1, 1988

Related U.S. Application Data

[63] Continuation of Ser. No. 913,355, Sep. 30, 1986, abandoned.

[51] Int. Cl.[4] .......................................... B23Q 11/02
[52] U.S. Cl. ............................ 409/137; 29/DIG. 82; 29/DIG. 84; 408/68
[58] Field of Search ................. 409/137, 145, 134; 408/51, 52, 67, 68; 144/251 A, 252 R; 29/DIG. 78, DIG. 82, DIG. 84

[56] References Cited

U.S. PATENT DOCUMENTS

3,022,806 2/1962 Johnson ........................ 144/252 R
3,880,047 4/1975 Dosier .............................. 409/137

Primary Examiner—Z. R. Bilinsky
Attorney, Agent, or Firm—S. C. Yuter

[57] ABSTRACT

A router for separating individual component mounted printed circuit boards from a panel consists of a routing machine and programmed control console which controls movement of a spindle assemblage in the routing machine in the Z direction and a table carrying the panel in the X and Y directions. A pressure foot housing, which encompasses the rotatable spindle nose of the spindle assemblage, has a rectangular brush at its end which presses against the panel to be cut by a routing bit. A vacuum exhaust system is attached to an angled port in the housing. The geometry of the housing area causes a vortex to be produced which sucks up all debris cut by the routing bit to the port to be exhausted from the housing.

38 Claims, 6 Drawing Sheets

SPINDLE SHOWN IN
DOWN POSITION

FIG. 6

ROUTER FOR COMPONENT MOUNTED PRINTED CIRCUIT BOARDS

This application is a continuation of application Ser. No. 913,355 filed 09/30/86 abandoned.

BACKGROUND OF THE INVENTION

1. Field of the Invention

This invention pertains to machines for cutting printed circuit boards and, more particularly, to a routing machine for cutting component mounted printed circuit boards.

2. Description of the Related Art

Printed circuit boards are widely used throughout the electronics industry. Often, two or more circuits are arranged on the same panel and the panel is cut into separate boards for each circuit after all of the components are mounted.

One method of separating circuit boards is to precut the bare panel except for connecting tabs. After all of the components are mounted and the printed circuit completed the tabs are either cut or broken to separate the individual boards.

A more rapid and precise system for separating individual component mounted circuit boards utilizes a high pressure water jet to cut the panel between circuits. This system requires that the components be resistant to water damage. Moreover, the cut boards must be cleaned afterwards to remove residual matter.

An improved system for separating individual component mounted printed circuit boards, previously developed by applicant's assignee and marketed as the ATI 400 Router, utilized a routing bit for cutting between the individual circuits boards of a panel pressed by a pressure foot brush, but debris removal by a vacuum exhaust system was not complete and left dust debris on the boards, which had to be removed before the boards could be packaged for shipment. The system was limited to components not exceeding a half inch in height. Moreover, the routing bit could only come within one-tenth of an inch of a component or circuit line on the printed circuit board.

BRIEF SUMMARY OF THE INVENTION

The general object of the invention is to provide an improved router for component mounted printed circuit boards.

Another object of the invention is to provide a router which is twice as fast as high pressure water jet systems and which is less expensive.

A specific object of the invention is to provide such a router which produces boards that are completely clean and thus ready for immediate packaging.

A more specific object of the invention is to provide a router which can cut boards with components up to an inch in height.

Another specific object of the invention is to provide a router which can cut within one-hundreth of an inch from the edge of a component or circuit line on the printed circuit board.

A further object of the invention is to provide a router which is dustfree, static free and with vibration forces which are not detrimental to the mounted components.

Briefly, in accordance with the invention, these and other objects of the invention are achieved by a router for separating individual component mounted printed circuit boards from a printed circuit board panel which includes a routing machine having a table movable in the X and Y directions for supporting the panel to be cut and a carrier plate movable in the Z direction on which is mounted a a rotatable spindle having a spindle nose for holding a routing bit. A programmed control console controls the movement of the table and carrier plate so that individual circuits may be precisely cut from the panel. A pressure foot housing, also mounted on the carrier plate and which encompasses the spindle nose, has a rectangular brush at its end which is pressed against the panel. A vacuum exhaust system is attached to an angled port in the side of the pressure foot housing. The bottom edge of the port is above the highest component on the panel. The bottom edge of the spindle nose is positioned with respect to the angled vacuum exhaust port so that the rotation of the spindle nose causes a vortex which sucks up all of the dust produced by the routing bit to the height of the port where the dust is exhausted from the pressure foot housing.

It should be noted that an expert in this art said that it was impossible to exhaust all of the dust. But applicant's invention as a whole does just that with a vortex generated by a critical combination of vacuum exhaust port angle in the pressure foot housing, the outer diameter size of the spindle nose relative to the inner diameter of the pressure foot housing, and the position of the bottom of the spindle nose with respect to the bottom of the vacuum exhaust port.

A feature of the invention is a mechanism for adjusting the height of the pressure foot housing above the surface of the printed circuit board panel to accomodate components of different maximum heights.

Another feature of the invention is that the brush used with component mounted printed circuit board panels may readily be replaced with a brush adapted to cut bare circuit board panels.

Among the advantages of the invention are: (1) a routing speed of 90 inches per minute with excellent edge quality; (2) less than 0.001" deflection from top to bottom of a printed circuit board; (3) no tooling fixtures are required; (4) up to four work stations are readily available; (5) the accuracy of routed circuits is + or −0.002"; (6) far less space is required than for prior routers, and (7) no internal pinning is required.

BRIEF DESCRIPTION OF THE DRAWINGS

Other objects, features and advantages of the invention will be apparent from the following Description of the Preferred Embodiment taken together with the accompanying drawings in which.

DESCRIPTION OF THE PREFERRED EMBODIMENT

Figure 1:
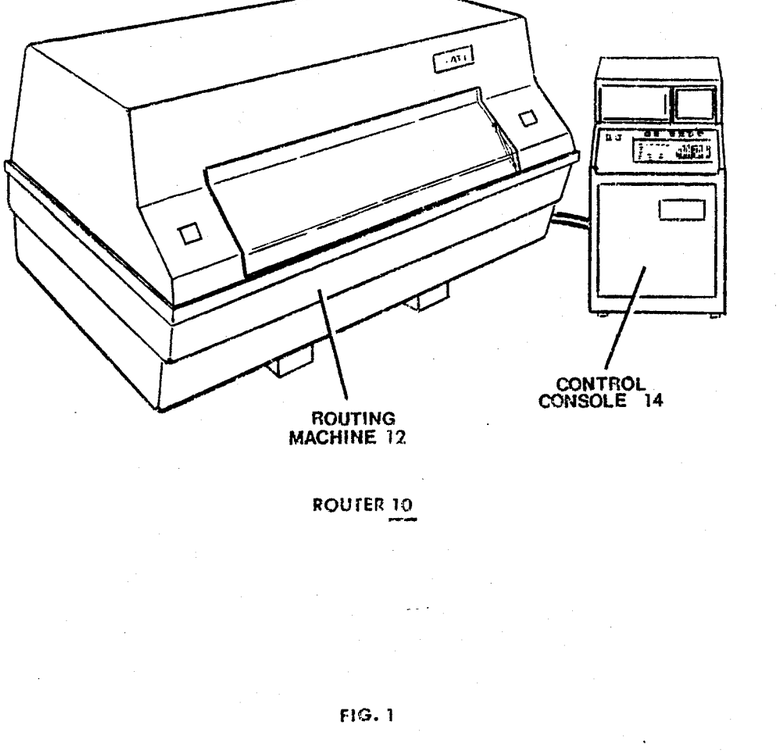
FIG. 1 is a perspective view of a routing machine and its programmed control console which embody a router for cutting component mounted printed circuit board panels in accordance with the preferred embodiment (best mode) of the invention.

Referring to FIG. 1, the router 10 comprises the routing machine 12 and the control console 14. The routing machine 12 includes a carrier plate 15 (FIG. 2) adapted to be moved in the Z direction under programmed control of control console 14. The routing machine 12 also includes a table 16 (FIG. 4) adapted to be moved in the X and Y directions under control of control console 14. This general system is well known in the prior art and will thus not be described in detail. An example of such a system is the ATI 400 Router sold by the Advanced Technology Industries Division of Richmark Camera Service, Inc., 180 Board Street, Carlstadt, N.J. 07072, applicant's assignee. The ATI 400 Router is one of various machines on the market known as computer numerical control routers comprising a router table and its programmed controller. Some use individually-powered spindles while others use a single power source to drive multiple spindles via a belt-driven system, like the ATI 400. The techniques and tooling materials for numerically controlled routing are described in an article entitled An Overview of Modern Routing Techniques by Leland E. Tull and Larry Stock in the October 1983 issue of PC FAB at pages 52–59. A combined Operating Manual and Programming Manual for the ATI 400 is readily available from Richmark Camera Service, Inc., and is hereby profferred to the Scientific Library of the U.S. Patent and Trademark Office.

Mounted on carrier plate 15 (FIG. 2) are duplicate spindle and pressure foot assemblages 20L and 20R which are belt driven by motor drive 24. Each assemblage 20L and 20R provides a separate work station for cutting printed circuit board panels. A spindle and pressure foot assemblage 20 is shown in detail in FIG. 3. It includes pressure foot solenoid 30, collett retract system 32, spindle 34, spindle nose 36, dust ring 38, pressure foot housing 40 and pressure foot brush assemblage 42. The pressure foot housing 40 is slidably supported on pressure foot rods 44 and 46, which are connected and reciprocally movable between the upper pressure foot housing 48 and the lower pressure foot housings 50R and 50L. A routing cutter 52 is held by spindle nose 36. Angularly connected to the front side wall of pressure foot housing 40 is a vacuum tube 56. A vacuum hose 58 connects vacuum tube 56 to a vacuum exhaust system. The vacuum exhaust power is 4.5 inches mercury at 180 surface cubic feet per minute.

The height of the pressure foot housing 40 (FIG. 4) above a printed circuit board panel 59 to be cut is adjustable by means of the adjusting knob 60 and adjustment lock 62 of the lower pressure foot housing 50R and adjustment lock 64. Adjustment knob 60 is connected vai a threaded shaft 66 to pressure foot housing 40. Rotation of adjustment knob 60 causes the pressure foot housing 40 to be raised or lowered along the pressure foot rods 44 and 46 to a desired distance above the circuit board panel 59. When the pressure foot housing 40 is set to that distance, the adjustment locks 62 and 64 are tightened to lock the pressure foot housing 40 in the set position. Pressure foot rod 46 slides freely within lower pressure foot housing 50L as the pressure foot height is adjusted. The setting of the height of the pressure foot housing 40 on the pressure foot rods 44 and 46 determines the lowest height the pressure foot housing 40 will descend to during movement of the carrier plate 15 (FIG. 2) along the Z axis under control of the control console 14 (FIG. 1).

The printed circuit board panel 59 (FIG. 4) with its mounted components 69 is temporarily mounted on three registry pins 70 (one is shown) which pass through corresponding holes in three of the corners of printed circuit board panel 59. The registry pins 70 pass through a foam panel 72 and are mounted in a Bakelite subplate 74. The foam panel 72 is cemented to the Bakelite subplate 74, which is fixed to table 16. Table 16 is moved in the X and Y directions under control of the control console 14 (FIG. 1).

Pressure foot brush assemblage 42 (FIG. 4) includes bristles 80 embedded in a bristle head 82 connected to a brush slide 84. Pressure foot brush assemblage 42 is slidable into a complementary shaped slot 84 at the bottom of pressure foot housing 40. Pressure foot brush assemblage 42 comprises a commercially available brush sold by the Fuller Brush Company of North Kansas City, Missouri under model number 8B9072-62. It is rectangular in cross section with outer dimensions 2.2 inches by 2.9 inches, 0.5 inch thick walls and 0.020 inch diameter bristles. The density of the bristles is approximately 280 per square inch. For components mounted on the circuit board panel 59 with a maximum height of 1.0 inch, the bristles are 2.0 inches in length; for components of a maximum height of 0.850 inches, the bristles are 1.750 in length, and for components of a maximum height of 0.600 inches, the bristles are 1.500 in length.

Figure 2:
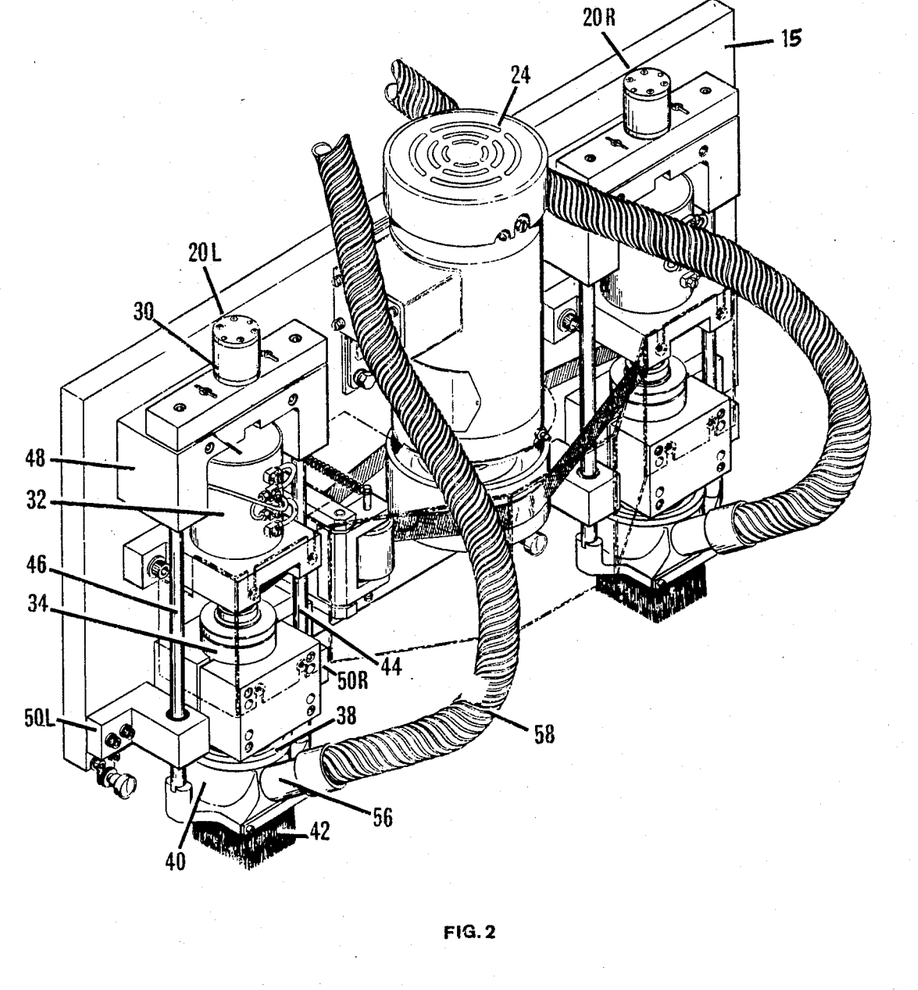
FIG. 2 is an isometric view of spindle and pressure foot assemblages and common motor drive of a two-station routing machine mounted on a carrier plate adapted to move along the Z axis.
Figure 4:
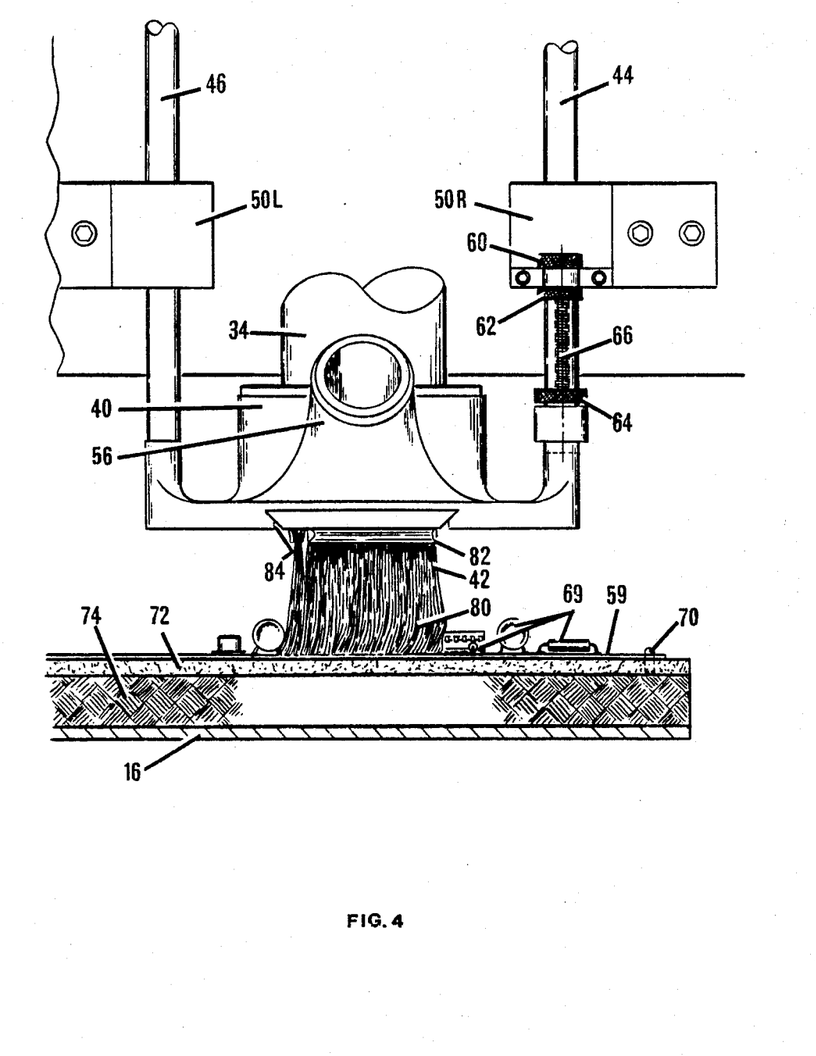
FIG. 4 is a front elevational view, partly in section, of the pressure foot housing and its adjusting mechanism for mounted components of different maximum heights.

Vacuum tube 56 is angularly connected to the side of pressure foot housing 40 at the front of each spindle and pressure assemblage 20 (FIGS. 2 and 4). A vacuum tube port 90 (FIG. 6) is formed at the junction of the inside end of vacuum tube 56 and the inside wall of the cavity 92 of pressure foot housing 40. The angle of the axis of vacuum tube 56, and thus vacuum tube port 90, with the horizontal is in the range of 25 to 35 degrees, with the optimum angle substantially 30 degrees.

Spindle 34 has an outside diameter of 2.450 inches. It fits within dust ring 38 which has an inside diameter of 2.460 inches and an outside diameter of 3.250 inches. It is belt driven by motor drive 24 (FIG. 2) at a rotational speed in the range of 5000 to 24,000 revolutions per minute. The preferred speed is 24,000 revolutions per minute.

Figure 6:
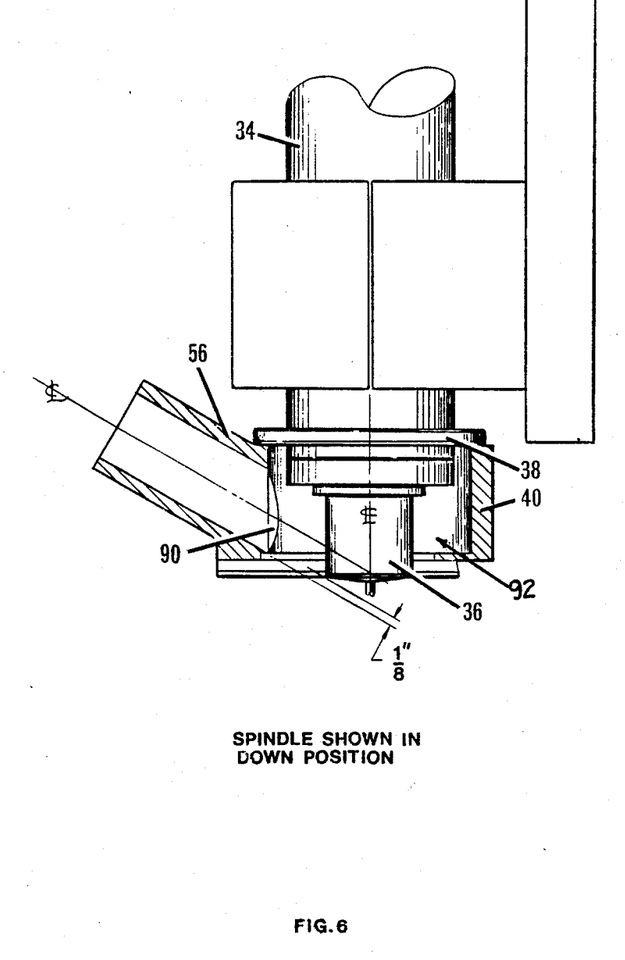
FIG. 6 is a front elevational view, partly in section, with the spindle nose shown at its critical vortex-producing operating position with respect to the vacuum tube port.

Spindle nose 36 in its vortex-producing operating position is shown in FIG. 6. It has an outer diameter of 1.255 inches. The inner diameter of cavity 92 of the pressure foot housing 40 is 2.950 inches. Thus the radial distance between the outside of spindle nose 36 and the inside of pressure foot housing 40 is 1.695 inches.

The vertical distance between a line drawn along the bottom of vacuum tube port 90 and a horizontal plane through the bottom surface of spindle nose 36 where the line and plane intersect at the vertical surface of spindle nose 36 nearest to vacuum tube port 90 is 0.125 inch.

The thickness of circuit board panel 59 (FIG. 5) can be from 0.031 to 0.250 inch. With components 69 mounted on circuit board panel 59 with a maximum height of 1.000 inch, the length of bristles 80 of pressure foot brush assemblage 42 is 2.000 inches, the length of routing cutter 52 extending from the bottom surface of spindle nose 36 is 2.000 inches and the bottom surface of spindle nose 36 is 1.300 inches above the top surface of circuit board panel 59.

Figure 5:
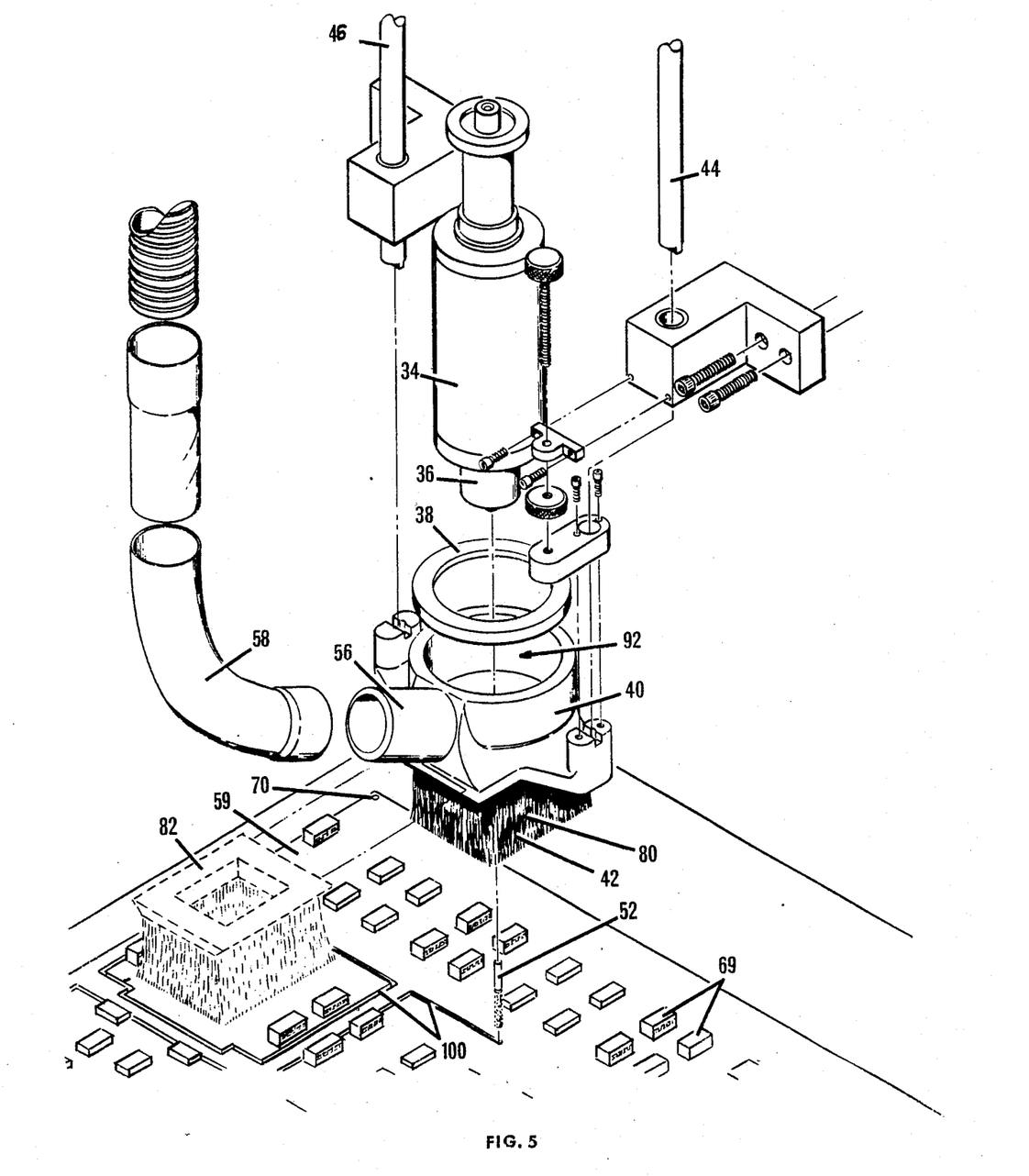
FIG. 5 is an exploded isometric side view of a portion of the spindle and pressure foot assemblage especially showing the angled vacuum tube port in the side wall of the pressure foot housing.

With components 69 with a maximum height of 0.850 inch the length of bristles 80 is 1.750 inches, the length of routing cutter 52 extending from the bottom surface of spindle nose 36 is 2.000 inches and the bottom surface of spindle nose 36 is 1.100 inches above the top surface of circuit board panel 90.

With components 69 with a maximum height of 0.600 inch the length of bristles 80 is 1.500 inches, the length of routing cutter 52 extending from the bottom surface of spindle nose 36 is 1.500 inches and the bottom surface of spindle nose 36 is 0.900 inch above the top surface of circuit board panel 59.

Since the vertical distance between the bottom of vacuum tube port 90 and the bottom of spindle nose 36 is always exactly the same, 0.0125 inch, irrespective of the height of bristles 80, the position of pressure foot housing 40 when it is in its operating position has to be reset every time a pressure foot brush assemblage 42 is changed to accomodate mounted components 69 with a different maximum height. That change of position is accomplished via the adjustment knob 60 (FIG. 4) and adjustment locks 62.

In operation, the control console 14 (FIG. 1) of router 10 is first programmed to control the operation of routing machine 14 to cut a printed circuit board panel 59 (FIG. 5) along predetermined paths such as path 100. The program can be entered from a punched paper tape or by the keyboard of control console 14 in accordance with well known techniques. Then a printed circuit board panel 59 (FIG. 4) is positioned on pins 70 of subplate 74 attached to table 16. The height of pressure foot housing 40 above the top surface of printed circuit board panel 59 is then set.

Assume the maximum height of components 69 is 1.000 inch, the bottom of spindle nose 36 (also see FIGS. 5 and 6) is set to be 1.300 inches above the surface of printed circuit board panel 59 when pressure foot housing 40 is in its clamp down position as set by control console 14. Prior to pressure foot housing 40 being set in its down clamp position it is raised by control console 14 to an up clamp position so that the length of routing bit 52 extending from the bottom surface of spindle nose 36 can be set, in this case to 1.300 inches. Then a pressure foot brush assemblage 42 with bristles of the correct height, in this case 2.000 inches, is inserted into groove 84 at the bottom of pressure foot housing 40. Then control console 14 lowers the pressure foot housing 40 to the down clamp position shown in FIG. 4.

The bristles 80 of pressure foot brush assemblage 42 press against the top surface of printed circuit board 59 enclosing with the cavity 92 of pressure foot housing 40 a space in which a vacuum will be created by the vacuum exhaust system (FIG. 3) coupled to the cavity 92 via the vacuum hose 58 (FIG. 5) and vacuum tube 56. The bottom of this vacuum exhausted space is the top surface of printed circuit board panel 59 enclosed by the bristles 80 of pressure foot brush assemblage 42. The top of this vacuum exhausted space is enclosed by dust ring 38, which closely encompasses spindle 34. Dust ring 38 is held against the top surface of pressure foot housing 40 by the vacuum created in the vacuum exhausted space.

When control console 14 lowers the pressure foot housing 40 (FIG. 4) to its down clamp position the bristles 80 in the side walls of the rectangular brush assemblage 42 may encounter one or more components 69 to transmit a lateral force to pressure foot housing 40. Since the top of pressure foot housing 40 slides along the bottom surface of dust ring 38, being kept in place only by the surrounded spindle 34 and the vacuum in the pressure foot housing 40, pressure foot housing 40 may move a limited amount laterally without unduly stressing the encountered components 69 and any spatial leads connected to them.

During cutting of the printed circuit board panel 59 the end of routing bit 52 (FIG. 5) just passes through the 0.0625 inch thickness of panel 59. As routing bit 52 follows the programmed path 100 debris is ground up from panel 59. Because of the geometry of the system a vortex is created (like a miniature tornado) spiralling from the top surface of panel 59 and spreading to a height just below the bottom surface of spindle nose 36. This vortex sucks up all of the debris cut from panel 59 to swirl around the bottom of spindle nose 36 where all of the debris is sucked out of cavity 92 by the vacuum exhaust present at vacuum exhaust port 90.

This vortex-creating debris-sucking geometry is a function of: (1) the angle of vacuum port 90 with the horizontal; (2) the radial distance between the outside of spindle nose 36 and the inside of pressure foot housing 40; (3) the vertical distance between the bottom surface of spindle nose 36 and a line extending into cavity 92 from the bottom of vacuum port 90; (4) the height of the bottom surface of spindle nose 36 above the top surface of printed circuit board panel 59, and (5) the rotational speed of spindle nose 36. Each of these factors is specifically disclosed above.

Figure 3:
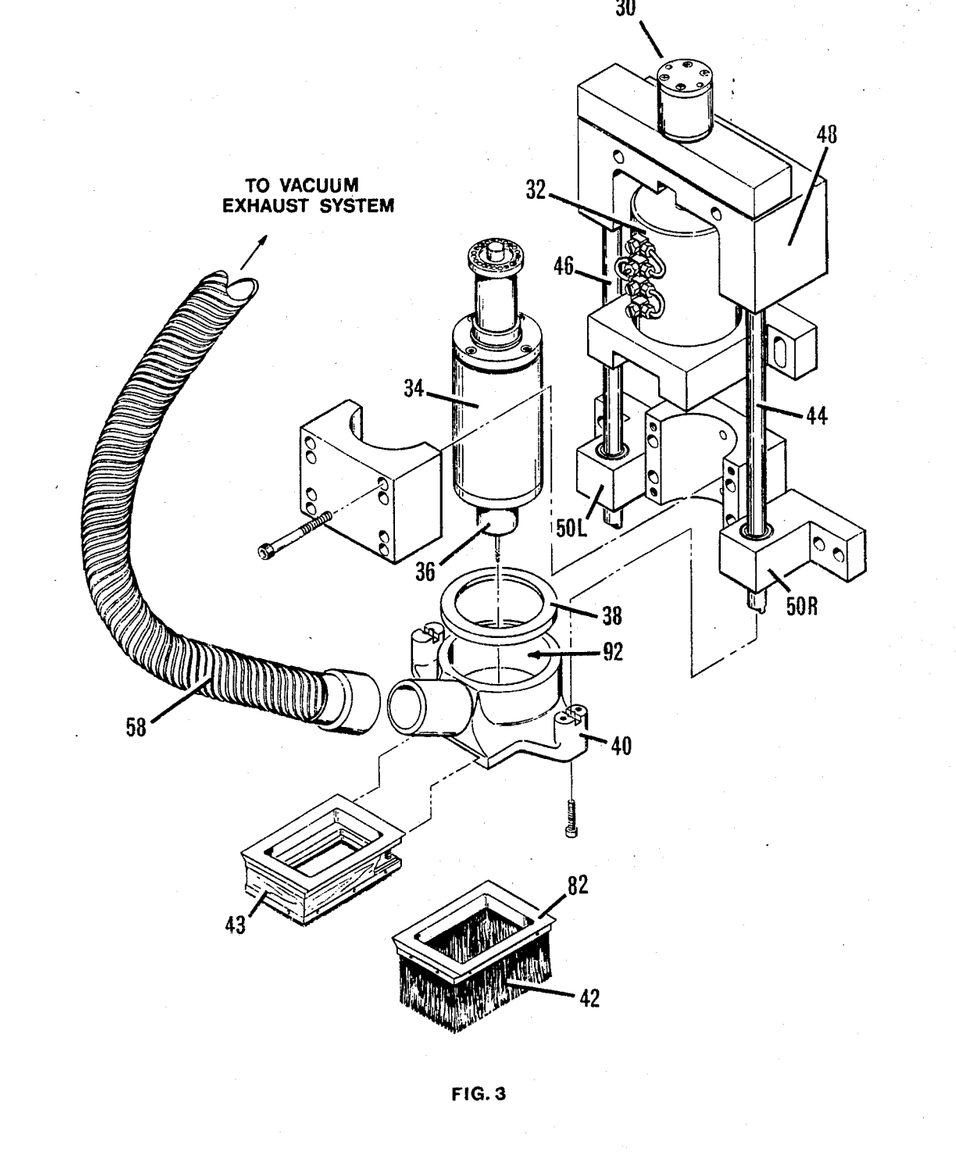
FIG. 3 is an exploded isometric view of one of the spindle and pressure foot assemblages, and showing the interchangeable brushes for component mounted and bare printed circuit board panels.

Finally, if a bare printed circuit board panel is to be cut, pressure foot brush assemblage 42 is replaced in the bottom of pressure foot housing 40 by bareboard pressure foot 43 as shown in FIG. 3.

Thus, in accordance with the invention, a router 10 has been provided accomplishing all of the objects, and having all of the features and advantages specified at the beginning of this specification.

What is claimed is:

1. A router for separating individual component mounted printed circuit boards from a printed circuit board panel containing two or more printed circuit boards comprising:
   (A) a routing machine having table support means adapted to move in the X and Y directions for supporting a printed circuit board panel to be cut into separate printed circuit boards;
   (B) said routing machine also having a carrier plate adapted to move in the Z direction;
   (C) a control console connected to said routing machine for controlling the movement of said table support means in the X and Y directions and the movement of said carrier plate in the Z direction;
   (D) pressure foot assemblage means mounted on said carrier plate;
   (E) spindle assemblage means mounted on said carrier plate;
   (F) a spindle nose included in said spindle assemblage means;
   (G) motor means for rotating said spindle nose at a predetermined speed;

(H) routing bit means connected to said spindle nose and adapted when rotated to cut a printed circuit board panel along a cutting path controlled by said control console;

(I) said pressure foot assemblage means further comprising (1) a pressure foot housing encompassing said spindle nose, (2) pressure foot brush means connected to the bottom of said pressure foot housing for pressing against the top surface of a printed circuit board panel to be cut, (3) a vacuum exhaust port connected to the side of said pressure foot housing at an angle of substantially 30 degrees with respect to a horizontal plane through the bottom surface of said spindle nose at its outer radial edge, and with its lower edge extension at substantially 0.125 inch below the closest outer radial edge of said spindle nose, and with said horizontal plane of said bottom surface of said spindle nose substantially 0.900 to 1.300 inches above the surface of a printed circuit board panel to be cut, and (4) vacuum exhaust means connected to said vacuum exhaust port;

(J) whereby, when said spindle nose is rotated at a rotational speed of substantially 24,000 revolutions per minute, a vortex is created in said pressure foot housing by virtue of said rotational speed, said substantially 30 degrees angle, said substantially 0.125 inch and said substantially 0.900 to 1.300 inches which sucks upwardly all of the dust, ground by said routing bit means from the printed circuit board panel, to said vacuum exhaust port to be removed from said pressure foot housing by said vacuum exhaust means.

2. A router for separating individual circuit boards from a printed circuit board panel containing two or more printed circuit boards comprising:

(A) a routing machine having table support means adapted to move in the X and Y directions for supporting a printed circuit board panel to be cut into separate printed circuit boards;

(B) said routing machine also having a carrier plate adapted to move in the Z direction;

(C) a control console connected to said routing machine for controlling the movement of said table support means in the X and Y directions and the movement of said carrier plate in the Z direction;

(D) pressure foot assemblage means mounted on said carrier plate;

(E) spindle assemblage means mounted on said carrier plate, with its bottom surface at a first predetermined distance above the surface of a printed circuit board panel to be cut;

(F) a spindle nose included in said spindle assemblage means;

(G) motor means for rotating said spindle nose at a predetermined speed;

(H) routing bit means connected to said spindle nose and adapted when rotated to cut a printed circuit board panel along a cutting path controlled by said control console;

(I) said pressure foot assemblage means further comprising (1) a pressure foot housing encompassing said spindle nose, with the difference of radial distance between the outside diameter of said spindle nose and the inside diameter of said pressure foot housing being a second predetermined distance;

(2) pressure foot brush means connected to the bottom of said pressure foot housing for pressing against the top surface of a printed circuit board panel to be cut, (3) a vacuum exhaust port connected to the side of said pressure foot housing at an angle within the range from substantially 25 degrees to substantially 35 degrees with respect to a horizontal plane passing through the bottom surface of said spindle nose, and with the lower edge extension of said vacuum exhaust port at a third predetermined distance below the closest outer radial edge of said spindle nose, and (J) vacuum exhaust means connected to said vacuum exhaust port;

(K) said first, second and third predetermined distances being chosen so that when said spindle nose is rotated at a speed above 5000 revolutions per minute, a vortex is created in said pressure foot housing which sucks upwardly all of the dust, ground by said routing bit means from the printed circuit board panel, with the top of said vortex within said third predetermined distance below said spindle nose;

(L) whereby said vacuum exhaust port connected to the side of said pressure foot housing at an angle, because its lower edge extension is thus alleged with said top of said vortex, causes all of said dust to be removed from said pressure foot housing by said vacuum exhaust means.

3. A router for separating individual circuit boards from a printed circuit board panel containing two or more printed circuit boards according to claim 2 wherein said vacuum exhaust port is connected to the side of said pressure foot housing at an angle with the horizontal of substantially 30 degrees.

4. A router for separating individual circuit boards from a printed circuit board panel containing two or more printed circuit boards according to claim 2 wherein said spindle nose is rotated in the range of 5000 to 24,000 revolutions per minute.

5. A router for separating individual circuit boards from a printed circuit board panel containing two or more printed circuit boards according to claim 2 wherein said spindle nose is rotated at substantially 24,000 revolutions per minute.

6. A router for separating individual circuit boards from a printed circuit board panel containing two or more printed circuit boards according to claim 2 wherein said lower edge extension of said vacuum exhaust port is substantially 0.125 inch below the closest outer radial edge of said spindle nose.

7. A router for separating individual circuit boards from a printed circuit board panel containing two or more printed circuit boards according to claim 2 wherein the bottom of said spindle nose is substantially 0.900 to 1.300 inches from the top surface of a printed circuit board panel to be cut.

8. A router for separating individual circuit boards from a printed circuit board panel containing two or more printed circuit boards according to claim 1 wherein the radial distance between the outer diameter of said spindle nose and the inner diameter of said pressure foot housing is substantially 1.7 inches.

9. A router for separating individual circuit boards from a printed circuit board panel containing two or more printed circuit boards according to claim 8 wherein the bottom of said spindle nose is substantially 0.900 to 1.300 inches from the top surface of a printed circuit board panel to be cut.

10. A router for separating individual circuit boards from a printed circuit board panel containing two or more printed circuit boards according to claim 9 wherein said spindle nose is rotated at substantially 24,000 revolutions per minute.

11. A router for separating individual circuit boards from a printed circuit board panel containing two or more printed circuit boards according to claim 3 wherein the bottom of said spindle nose is substantially 0.900 to 1.300 inches from the top surface of a printed circuit board panel to be cut.

12. A router for separating individual circuit boards from a printed circuit board panel containing two or more printed circuit boards according to claim 8 wherein said pressure foot brush means is adapted to slide into said pressure foot housing.

13. A router for separating individual circuit boards from a printed circuit board panel containing two or more printed circuit boards according to claim 12 wherein a bare board routing pressure foot is adapted to slide into said pressure foot housing in place of said pressure foot brush means.

14. A router for separating individual circuit boards from a printed circuit board panel containing two or more printed circuit boards according to claim 8 wherein said pressure foot assemblage means further comprises adjusting means for adjusting the height of said pressure foot housing and therefore said vacuum exhaust port above the surface of a printed circuit panel board panel supported on said table support means.

15. A router for separating individual circuit boards from a printed circuit board panel containing two or more printed circuit boards according to claim 14 wherein said adjusting means comprises rod support means slidably connected to said pressure foot housing and locking means for locking said pressure foot housing in a fixed position above the surface of a printed circuit panel board.

16. A router for separating individual component mounted printed circuit boards from a printed circuit board panel containing two or more printed circuit boards comprising:
(A) a routing machine having table support means adapted to move in the X and Y directions for supporting a printed circuit board panel to be cut into separate printed circuit boards;
(B) said routing machine also having a carrier plate adapted to move in the Z direction;
(C) a control console connected to said routing machine for controlling the movement of said table support means in the X and Y directions and the movement of said carrier plate in the Z direction;
(D) spindle and pressure foot assemblage means mounted on said carrier plate;
(E) said spindle and pressure foot assemblage means further comprising
 (1) a dust ring surrounding said spindle assemblage means portion of said spindle and pressure foot assemblage means,
 (2) a spindle nose,
 (3) a pressure foot housing encompassing said spindle nose and slidably abutting said dust ring,
 (4) pressure foot brush means connected to the bottom of said pressure foot housing for pressing against the top surface of a printed circuit board panel to be cut;
(F) routing bit means connected to said spindle nose and adapted when rotated to cut a printed circuit board panel along a cutting path controlled by said control console;
(G) motor means for rotating said spindle nose at a predetermined speed whereby because of the physical relationship of the portions of said spindle and pressure foot assemblage a vortex is created;
(H) said pressure foot and spindle assemblage means further comprising height-adjustable pressure foot brush assemblage means for pressing against the top surface of a printed circuit board panel to be cut; and
(I) vacuum exhaust means connected to said pressure foot housing for creating a vacuum in said pressure foot housing which slidably holds said pressure foot housing against the bottom surface of said dust ring, whereby if said pressure foot brush means encounters a component mounted on said printed circuit board as it descends towards said printed circuit board, said pressure foot housing may move a limited amount laterally to avoid unduly stressing the encountered component, and which also exhausts dust from the routed printed circuit panel sucked up by said vortex.

17. A router for separating individual circuit boards from a printed circuit board panel containing two or more printed circuit boards according to claim 16 wherein said pressure foot housing has an angled vacuum exhaust port, wherein the angle with the horizontal of said angled vacuum exhaust port is substantially 30 degrees, whereby when said spindle nose is rotated said vortex is created in said pressure foot housing means which sucks up all of the dust ground by said routing bit means from the printed circuit board panel for removal from said pressure foot housing means by said vacuum exhaust means.

18. A router for separating individual circuit boards from a printed circuit board panel containing two or more printed circuit boards according to claim 17 wherein said angle with the horizontal of said angled vacuum exhaust port is in the range of 25 to 35 degrees.

19. A router for separating individual component mounted printed circuit boards from a printed circuit board panel containing two or more printed circuit boards comprising:
(A) a routing machine having table support means adapted to move in the X and Y directions for supporting a printed circuit board panel to be cut into separate printed circuit boards;
(B) said routing machine also having a carrier plate adapted to move in the Z direction;
(C) a control console connected to said routing machine for controlling the movement of said table support means in the X and Y directions and the movement of said carrier plate in the Z direction;
(D) spindle assemblage means connected to said carrier plate;
(E) routing bit means connected to said spindle assemblage means and adapted when rotated to cut a printed circuit board panel along a cutting path controlled by said control console;
(F) motor means connected to said carrier plate for rotating said routing bit means at a predetermined speed;

(G) pressure foot housing means connected to said carrier plate;

(H) brush means connected to said pressure foot housing means for pressing against the top surface of a printed circuit board panel to be cut; and (I) vortex means for creating a vortex in said pressure foot housing means which sucks up all of the dust ground by said routing bit means from the printed circuit board panel.

20. A router for separating individual circuit boards from a printed circuit board panel containing two or more printed circuit boards according to claim 19 further comprising vacuum exhaust means connected to said pressure foot housing means for exhausting the dust ground by said routing bit means from the printed circuit board panel which is sucked up by said vortex means.

21. A router for separating individual circuit boards from a printed circuit board panel containing two or more printed circuit boards according to claim 20 further comprising a dust ring encompassing said spindle assemblage means and slidably abutting the top surface of said pressure foot housing, said dust ring being maintained in position by the vacuum in said pressure foot housing means caused by said vacuum exhaust means, whereby if said pressure foot brush means encounters a component mounted on said printed circuit board as it descends towards said printed circuit board, said pressure foot housing may move a limited amount laterally with respect to said slidably abutting dust ring to avoid unduly stressing the encountered component.

22. A router for separating individual circuit boards from a printed circuit board panel containing two or more printed circuit boards according to claim 3 wherein said lower edge extension of said vacuum exhaust port is substantially 0.125 inch below the closest outer radial edge of said spindle nose.

23. A router for separating individual circuit boards from a printed circuit board panel containing two or more printed circuit boards according to claim 4 wherein said lower edge extension of said vacuum exhaust port is substantially 0.125 inch below the closest outer radial edge of said spindle nose.

24. A router for separating individual circuit boards from a printed circuit board panel containing two or more printed circuit boards according to claim 5 wherein said lower edge extension of said vacuum exhaust port is substantially 0.125 inch below the closest outer radial edge of said spindle nose.

25. A router for separating individual circuit boards from a printed circuit board panel containing two or more printed circuit boards according to claim 7 wherein said lower edge extension of said vacuum exhaust port is substantially 0.125 inch below the closest outer radial edge of said spindle nose.

26. A router for separating individual circuit boards from a printed circuit board panel containing two or more printed circuit boards according to claim 1 wherein said vacuum exhaust means connected to said pressure foot housing means for exhausting the dust ground by said routing bit means from the printed circuit board panel, which is sucked up by said vortex means, has a vacuum power of substantially 4.5 inches of mercury at substantially 180 cubic feet per minute.

27. A router for separating individual circuit boards from a printed circuit board panel containing two or more printed circuit boards according to claim 2 wherein said vacuum exhaust means connected to said pressure foot housing means for exhausting the dust ground by said routing bit means from the printed circuit board panel, which is sucked up by said vortex means, has a vacuum power of substantially 4.5 inches of mercury at substantially 180 cubic feet per minute.

28. A router for separating individual circuit boards from a printed circuit board panel containing two or more printed circuit boards according to claim 3 wherein said vacuum exhaust means connected to said pressure foot housing means for exhausting the dust ground by said routing bit means from the printed circuit board panel, which is sucked up by said vortex means, has a vacuum power of substantially 4.5 inches of mercury at substantially 180 cubic feet per minute.

29. A router for separating individual circuit boards from a printed circuit board panel containing two or more printed circuit boards according to claim 4 wherein said vacuum exhaust means connected to said pressure foot housing means for exhausting the dust ground by said routing bit means from the printed circuit board panel, which is sucked up by said vortex means, has a vacuum power of substantially 4.5 inches of mercury at substantially 180 cubic feet per minute.

30. A router for separating individual circuit boards from a printed circuit board panel containing two or more printed circuit boards according to claim 5 wherein said vacuum exhaust means connected to said pressure foot housing means for exhausting the dust ground by said routing bit means from the printed circuit board panel, which is sucked up by said vortex means, has a vacuum power of substantially 4.5 inches of mercury at substantially 180 cubic feet per minute.

31. A router for separating individual circuit boards from a printed circuit board panel containing two or more printed circuit boards according to claim 6 wherein said vacuum exhaust means connected to said pressure foot housing means for exhausting the dust ground by said routing bit means from the printed circuit board panel, which is sucked up by said vortex means, has a vacuum power of substantially 4.5 inches of mercury at substantially 180 cubic feet per minute.

32. A router for separating individual circuit boards from a printed circuit board panel containing two or more printed circuit boards according to claim 7 wherein said vacuum exhaust means connected to said pressure foot housing means for exhausting the dust ground by said routing bit means from the printed circuit boad panel, which is sucked up by said vortex means, has a vacuum power of substantially 4.5 inches of mercury at substantially 180 cubic feet per minute.

33. A router for separating individual circuit boards from a printed circuit board panel containing two or more printed circuit boards according to claim 2 wherein said difference of radial distance between the outside diameter of said spindle nose and the inside diameter of said pressure foot housing is substantially 1.7 inch.

34. A router for separating individual circuit boards from a printed circuit board panel containing two or more printed circuit boards according to claim 3 wherein said difference of radial distance between the outside diameter of said spindle nose and the inside diameter of said pressure foot housing is substantially 1.7 inch.

35. A router for separating individual circuit boards from a printed circuit board panel containing two or more printed circuit boards according to claim 4 wherein said difference of radial distance between the outside diameter of said spindle nose and the inside diameter of said pressure foot housing is substantially 1.7 inch.

36. A router for separating individual circuit boards from a printed circuit board panel containing two or more printed circuit boards according to claim 5 wherein said difference of radial distance between the outside diameter of said spindle nose and the inside diameter of said pressure foot housing is substantially 1.7 inch.

37. A router for separating individual circuit boards from a printed circuit board panel containing two or more printed circuit boards according to claim 6 wherein said difference of radial distance between the outside diameter of said spindle nose and the inside diameter of said pressure foot housing is substantially 1.7 inch.

38. A router for separating individual circuit boards from a printed circuit board panel containing two or more printed circuit boards according to claim 7 wherein said difference of radial distance between the outside diameter of said spindle nose and the inside diameter of said pressure foot housing is substantially 1.7 inch.

* * * * *

UNITED STATES PATENT AND TRADEMARK OFFICE
CERTIFICATE OF CORRECTION

PATENT NO. : 4,909,681

DATED : Mar. 20, 1990

INVENTOR(S) : Joseph P. Drier, Jr.

It is certified that error appears in the above-identified patent and that said Letters Patent is hereby corrected as shown below:

The title page showing the illustrative figure should be deleted to appear as per attached title page.

Signed and Sealed this

Twenty-eighth Day of August, 1990

*Attest:*

HARRY F. MANBECK, JR.

*Attesting Officer*   *Commissioner of Patents and Trademarks*

United States Patent [19]

Drier, Jr.

[11] Patent Number: 4,909,681

[45] Date of Patent: Mar. 20, 1990

[54] ROUTER FOR COMPONENT MOUNTED PRINTED CIRCUIT BOARDS

[75] Inventor: Joseph P. Drier, Jr., Bellingham, Mass.

[73] Assignee: Cybernetics Products, Inc., Carlstadt, N.J.

[21] Appl. No.: 265,699

[22] Filed: Nov. 1, 1988

Related U.S. Application Data

[63] Continuation of Ser. No. 913,355, Sep. 30, 1986, abandoned.

[51] Int. Cl.$^4$ .............................................. B23Q 11/02
[52] U.S. Cl. .............................. 409/137; 29/DIG. 82; 29/DIG. 84; 408/68
[58] Field of Search ........................ 409/137, 145, 134; 408/51, 52, 67, 68; 144/251 A, 252 R; 29/DIG. 78, DIG. 82, DIG. 84

[56] References Cited

U.S. PATENT DOCUMENTS

| 3,022,806 | 2/1962 | Johnson | 144/252 R |
| 3,880,047 | 4/1975 | Dosier | 409/137 |

Primary Examiner—Z. R. Bilinsky
Attorney, Agent, or Firm—S. C. Yuter

[57] ABSTRACT

A router for separating individual component mounted printed circuit boards from a panel consists of a routing machine and programmed control console which controls movement of a spindle assemblage in the routing machine in the Z direction and a table carrying the panel in the X and Y directions. A pressure foot housing, which encompasses the rotatable spindle nose of the spindle assemblage, has a rectangular brush at its end which presses against the panel to be cut by a routing bit. A vacuum exhaust system is attached to an angled port in the housing. The geometry of the housing area causes a vortex to be produced which sucks up all debris cut by the routing bit to the port to be exhausted from the housing.

38 Claims, 6 Drawing Sheets